(12) United States Patent
Hirota

(10) Patent No.: US 7,020,588 B2
(45) Date of Patent: Mar. 28, 2006

(54) DESIGN VARIABLE OPTIMIZATION SYSTEM AND DESIGN VARIABLE OPTIMIZATION METHOD

(75) Inventor: Tomoo Hirota, Ichihara (JP)

(73) Assignee: Sumitomo Chemical Company, Limited, Osaka (JP)

( * ) Notice: Subject to any disclaimer, the term of this patent is extended or adjusted under 35 U.S.C. 154(b) by 832 days.

(21) Appl. No.: 09/867,634

(22) Filed: May 31, 2001

(65) Prior Publication Data

US 2002/0002446 A1 Jan. 3, 2002

(30) Foreign Application Priority Data

Jun. 2, 2000 (JP) ............................ P2000-166276

(51) Int. Cl.
*G06F 17/50* (2006.01)
*G06F 17/10* (2006.01)
(52) U.S. Cl. .............................................. 703/2; 703/1
(58) Field of Classification Search .................... 703/1, 703/2
See application file for complete search history.

(56) References Cited

U.S. PATENT DOCUMENTS 5,557,710 A * 9/1996 Amdursky et al. ......... 345/419
6,132,108 A * 10/2000 Kashiwamura et al. ........ 703/2

* cited by examiner

*Primary Examiner*—Hugh Jones
(74) *Attorney, Agent, or Firm*—Sughrue Mion, PLLC

(57) ABSTRACT

A design variable optimization system including a performance value calculating section for performing an analysis on a design article using numerous design variables and for calculating a performance value for evaluating the performance of the design article using each of the design variables, based on the result of analysis. A design variable determining section is provided for determining an optimal design variable among the design variables, based on each of performance values calculated by the performance value calculating section and a certain evaluation criterion. An analysis end time determining section is provided for determining an end time of the analysis in the performance value calculating section so that a difference between an end time of a period necessary for the calculation of the performance value and the end time of the analysis becomes a predetermined, fixed value.

8 Claims, 6 Drawing Sheets

DESIGN VARIABLE OPTIMIZATION SYSTEM AND DESIGN VARIABLE OPTIMIZATION METHOD

BACKGROUND OF THE INVENTION

1. Field of the Invention

The present invention relates to a design variable optimization system and a design variable optimization method for determining a specific design variable from among numerous design variables according to a particular evaluation criterion, for a design article whose performance varies with change of the design variable.

2. Related Background Art

There are well-known design variable optimization systems for determining a specific design variable from among numerous design variables according to a particular evaluation criterion, for a design article whose performance varies with change of the design variable. Such design variable optimization systems normally include a performance value calculating section for carrying out an analysis (simulation) on a design article for a fixed time using each of the design variables and for calculating a performance value for evaluating the performance of the design article using each of the design variables, based on the result of the analysis. Known systems also include a design variable determining section for applying each of the performance values calculated by the performance value calculating section, to the foregoing evaluation criterion, thereby determining an optimal design variable from among the numerous available design variables.

For example, let us consider designing an article such as a pillar of a car. The pillar of a car is a design article whose so-called "upper interior head impact protection requirements" varies according to several design variables, e.g., the thickness of ribs located on the pillar, the thickness of the outer wall of the pillar, and the interval between the ribs of the pillar. Namely, when the pillar is designed in a design variable optimization system, the aforementioned performance value calculating section first calculates by simulation a dynamic change of acceleration within a fixed time during a collision of an object (e.g., Free Motion Headform) with the pillar using a combination of each of the design variables, i.e., variously changed values of the thickness of the ribs on the pillar, the outer wall thickness of the pillar, and the intervals between ribs on the pillar. The performance value calculating section further calculates an HIC(d) as a performance value for evaluating the upper interior head impact protection requirements of the pillar of the car, using a calculated dynamic change of acceleration. The design variable determining section then compares the various HIC(d) calculated by the performance value calculating section, and determines a combination of rib thickness on the pillar, outer wall thickness of the pillar, and rib interval on the pillar that provides a minimum HIC(d), thus achieving an optimal design for the pillar.

SUMMARY OF THE INVENTION

However, known design variable optimization systems are disadvantageous. Namely, known design variable optimization systems carry out analysis on each design variable of the design article for an equal and fixed amount of time, regardless of whether or not such as necessary, in order to calculate each of the performance values for evaluating the performance of the design article. However, the result of the analysis on the design article often differs depending upon each of the design variables, so that the analysis time necessary for the above calculation of a performance value often differs depending upon each design variable. As a consequence, if the analysis on the design article is carried out in the known manner described above, analysis on the design article will be conducted even when not necessary for the calculation of a performance value, thus requiring a long time for the determination of a design variable.

The present invention has been accomplished to, among other things, avoid the above discussed disadvantages of known systems. Thus an object of the invention is to provide a design variable optimization system and a design variable optimization method capable of determining a design variable within a short time.

For accomplishing the above object, and other objects, a design variable optimization system is provided according to the present invention whereby a specific design variable is determined from among numerous design variables according to a certain evaluation criterion, for a design article whose performance varies with change of the design variable. The system in accordance with the present invention includes performance value calculating means for performing an analysis on the design article using the design variables and for calculating a performance value for evaluating the performance of the design article using each of the design variables, based on the result of the analysis. A design variable determining means is also provided for determining the specific design variable among the design variables, based on each of the performance values calculated by the performance value calculating means and the evaluation criterion. An analysis end time determining means is provided for determining an end time of the analysis in the performance value calculating means so that a prescribed relation is satisfied by an end time of a period necessary for the calculation of the performance value and the end time of the analysis.

For also accomplishing the above object, and other objects, a design variable optimization method is provided according to the present invention whereby a specific design variable is determined from among numerous design variables according to a certain evaluation criterion, for a design article whose performance varies with change of the design variable. The method in accordance with the present invention includes a performance value calculating step of performing an analysis on the design article using each of the design variables and calculating a performance value for evaluating the performance of the design article. The method also includes a design variable determining step of determining the specific design variable from among all of the design variables, based on each of performance values calculated in the performance value calculating step using an evaluation criterion. The method also includes an analysis end time determining step of determining an end time of the analysis in the performance value calculating step so that a prescribed relation is satisfied by an end time of a period necessary for the calculation of the performance value and the end time of the analysis.

Since the end time of the analysis is determined so that the prescribed relation is satisfied by the end time of the period necessary for the calculation of the performance value and the end time of the analysis, protracted and unnecessary analysis is avoided during the calculation of the performance value, and thus the analysis can be carried out efficiently. As a result, the design variable can be determined within a short time.

The present invention will be more fully understood from the detailed description given hereinbelow and the accompanying drawings, which are given by way of illustration only and are not to be considered as limiting the scope of the present invention.

Additionally, further scope of applicability of the present invention beyond that of the particular embodiments discussed herein will be apparent to one skilled in the art from the detailed description given hereinafter. Therefore, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
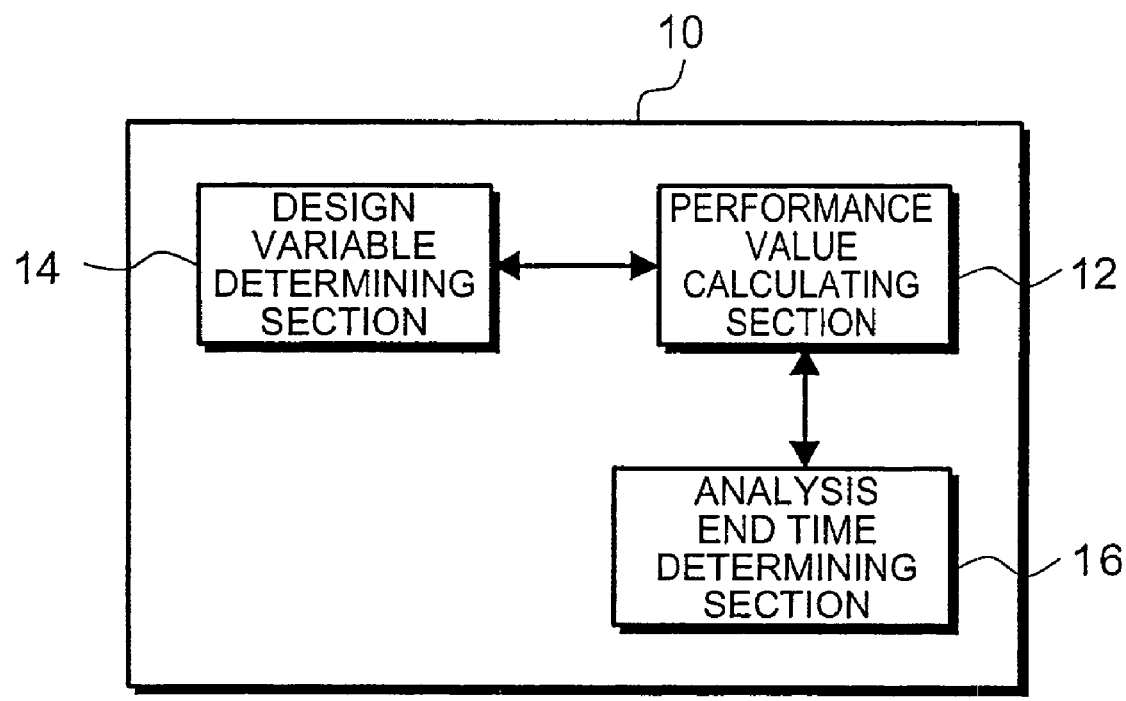
FIG. 1 is a block diagram of a design variable optimization system in accordance with the present invention.

Design variable optimization systems according to the present invention will be described with reference to the drawings. First, the structure of a design variable optimization system according to the present embodiment will be described. FIG. 1 is a block diagram of a design variable optimization system in accordance with the present invention.

The design variable optimization system 10 according to the present embodiment is generally a design variable optimization system for determining a specific design variable from among numerous design variables according to a certain evaluation criterion, for a design article that varies its performance with change of design variable. More specifically, it is, for example, a design variable optimization system for determining the optimal rib thickness of a pillar, outer wall thickness of the pillar, and rib interval of the pillar (specific design variable) presenting the minimum HIC(d) (certain evaluation criterion), which is a valuation of the upper interior head impact protection requirements, for the pillar (design article) of a car that varies the upper interior head impact protection requirements (performance) with change in the rib thickness of the pillar, the outer wall thickness of the pillar, and the rib interval of the pillar (design variable).

Figure 6:
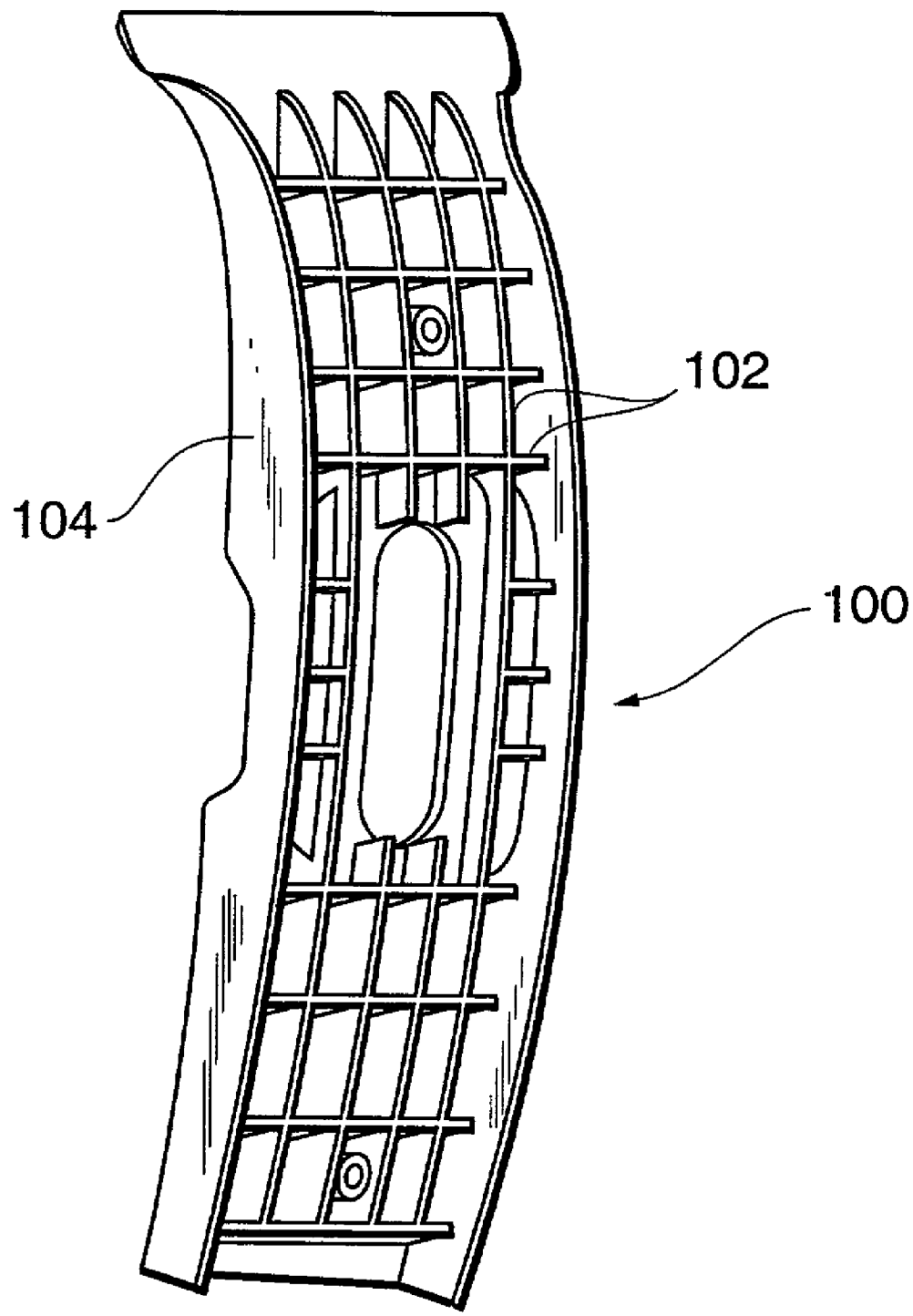
FIG. 6 is a perspective view of a pillar.

Pillar is one of the energy absorbing parts of car, which is described in FIG. 6. Pillar 100 is mainly constructed of ribs 102 and outer walls 104.

The design variable optimization system 10 of the present invention in one embodiment is composed, as shown in FIG. 1, of a performance value calculating section 12, a design variable determining section 14, and an analysis end time determining section 16. Each of the components will be described below in detail.

The performance value calculating section 12 performs the analysis on the design article using each of the design variables and calculates a performance value for evaluating the performance of the design article, based on the result of the analysis. Here the analysis on the design article, carried out by the performance value calculating section 12, is a simulation concerning dynamic behavior of the design article.

More specifically, the performance value calculating section 12 performs the analysis on the pillar of a car based upon combinations of a variety of rib thicknesses of the pillar, outer wall thicknesses of the pillar, and rib intervals of the pillar, and calculates the HIC(d), which is a performance value for evaluating the performance of the pillar of the car.

Figure 2:
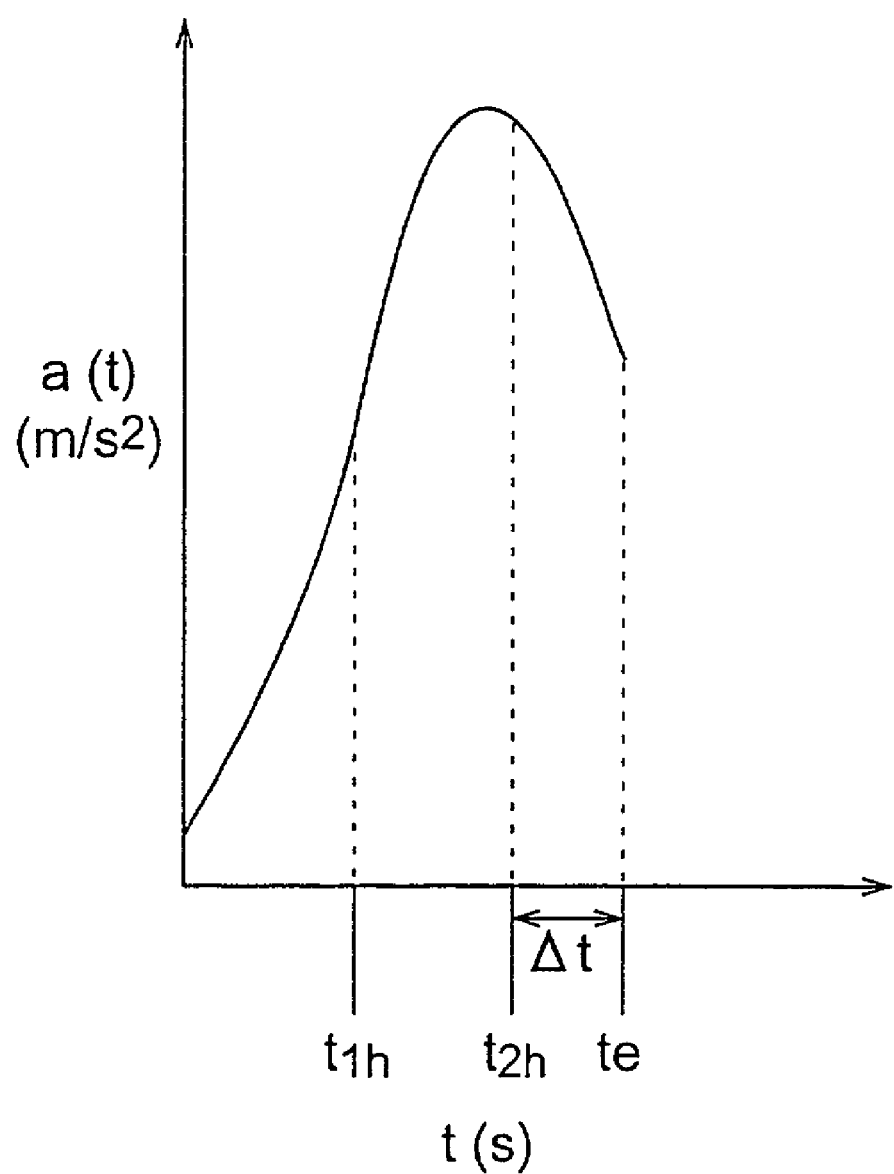
FIG. 2 is a diagram showing a dynamic change of acceleration a(t)

Namely, the performance value calculating section 12 first calculates the acceleration a(t) of Free Motion Headform at time t when Free Motion Headform collides with a pillar of car having a particular combination of rib thickness of the pillar, outer wall thickness of the pillar, and rib interval of the pillar, all set by the design variable determining section 14. The acceleration a(t) is calculated by numerically solving a modeled collision phenomenon between the pillar of a car and Free Motion Headform using a differential equation (simulation), and it changes with time, for example, as shown in FIG. 2. Here the performance value calculating section 12 continues the calculation of acceleration a(t), particularly, up to an analysis end time $t_e$ determined by the analysis end time determining section 16 (the details of which will be described hereinafter).

In addition to the calculation of acceleration a(t), the performance value calculating section 12 also calculates a valuation $f(t_1, t_2)$ represented by Eq (1) below, in a time domain where the acceleration a(t) has already been calculated. The valuation $f(t_1, t_2)$ is calculated for each of various combinations of $t_1$ and $t_2$ varied under a certain condition $(0 < t_2 - t_1 \leq 36$ ms$)$.

$$f(t_1, t_2) = \left(\frac{1}{t_2 - t_1}\int_{t_1}^{t_2} a(t)dt\right)^{2.5} \times (t_2 - t_1) \quad (1)$$

$$0 < t_2 - t_1 \leq 36 \text{ ms}$$

The performance value calculating section 12 further calculates an HIC value, using the above valuations $f(t_1, t_2)$. The HIC value is calculated using Eq (2) below.

$$HIC = \text{Max}(f(t_1, t_2)) \quad (2)$$

In this equation, $\text{Max}(f(t_1, t_2))$ means a maximum of $f(t_1, t_2)$ with change of $t_1$ and $t_2$. Here the valuation $f(t_1, t_2)$ is not calculated in the time domain where the acceleration a(t) is not calculated. More precisely speaking, $\text{Max}(f(t_1, t_2))$ thus means the maximum of valuation $f(t_1, t_2)$ with change of $t_1$ and $t_2$ in the time domain $(0 \leq t \leq t_e)$ where the acceleration a(t) is calculated last. Here, let us particularly define $t_{1h}$ and $t_{2h}$ as $t_1$ and $t_2$ presenting the maximum valuation $f(t_1, t_2)$, i.e., as $t_1$ and $t_2$ corresponding to the HIC value.

The HIC(d) is calculated using Eq (3) below, based on the foregoing HIC value.

$$HIC(d) = 0.75446 \times HIC + 166.4 \quad (3)$$

Here the HIC(d) is qualitatively a value indicating the magnitude of impact exerted on Free Motion Headform, and the HIC(d) is desirably not more than 1000 in design of the pillar of a car.

The design variable determining section 14 sequentially sets numerous design variables for the calculation of acceleration a(t) and HIC(d) in the performance value calculating section 12 and determines a specific design variable among numerous design variables, based on each of numerous performance values calculated by the performance value calculating section 12 and based on the certain evaluation criterion. More specifically, the design variable determining section 14 sets numerous combinations as to the rib thickness of the pillar, outer wall thickness of the pillar, and rib interval of the pillar for the calculation of acceleration a(t) and HIC(d) in the performance value calculating section 12 and determines a combination of a rib thickness of the pillar, an outer wall thickness of the pillar, and a rib interval of the pillar presenting a minimum of HIC(d) calculated by the performance value calculating section 12 under the thus set combinations of the rib thickness of the pillar, outer wall thickness of the pillar, and rib interval of the pillar, as an optimal combination of rib thickness of the pillar, outer wall thickness of the pillar, and rib interval of the pillar.

The analysis end time determining section 16 determines an end time of the analysis in the performance value calculating section 12 so that a prescribed relation is met by an end time of a period necessary for the calculation of performance value and the end time of the above analysis. More specifically, the analysis end time determining section 16 determines the end time of the analysis so that a difference between the end time of the period necessary for the calculation of performance value and the end time of the analysis becomes a predetermined, fixed value. More specifically, the analysis end time determining section 16 determines the analysis end time $t_e$ so that the difference between the end time $t_{2h}$ of the period necessary for the calculation of HIC(d) (i.e., the period necessary for the calculation of HIC value, which will also apply to the following), $t_{1h}$ to $t_{2h}$, and the analysis end time $t_e$ (the end time of the calculation of acceleration a(t)) becomes the predetermined, fixed value $\Delta t$, as shown in FIG. 2. Namely, the performance value calculating section 12 continues the calculation of acceleration a(t) up to the analysis end time $t_e$ determined as described above.

Figure 3A:
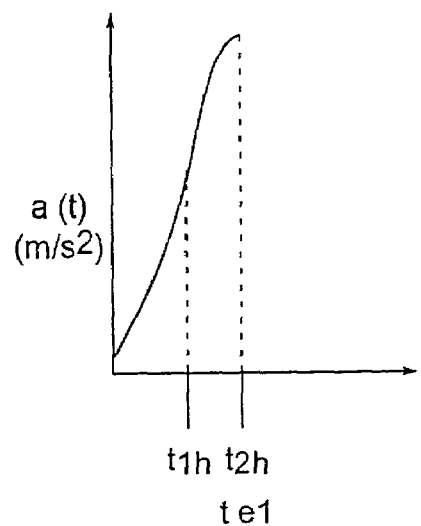
FIG. 3A to FIG. 3C are diagrams showing determination procedures of analysis end time $t_e$.

The determination procedures of the analysis end time $t_e$ will be described in more detail, referring to FIG. 3A to FIG. 3C. First, let us consider a case where the calculation of acceleration a(t) has been performed up to a time $t_{e1}$, as shown in FIG. 3A. If the HIC(d) is calculated assuming the time $t_{e1}$ as the analysis end time $t_e$, the end time $t_{2h}$ of the period $t_{1h}$ to $t_{2h}$ necessary for the calculation of the HIC(d) will become equal to the above time $t_{e1}$, so that the difference between the end time $t_{2h}$ of the period $t_{1h}$ to $t_{2h}$ necessary for the calculation of the HIC(d) and the analysis end time $t_e$ cannot be the predetermined, fixed value $\Delta t$. Therefore, the time $t_{e1}$ cannot be the analysis end time $t_e$, and the performance value calculating section 12 further continues the calculation of acceleration a(t).

Figure 3B:
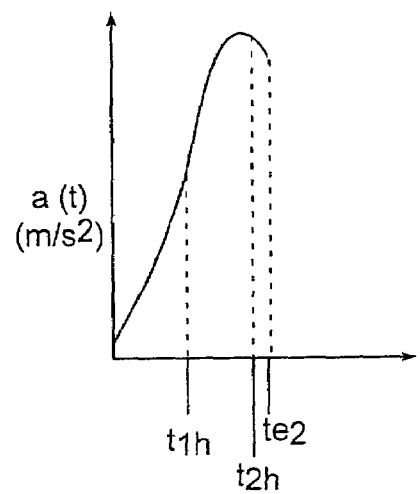

In the next place, as shown in FIG. 3B, there is illustrated the situation where the calculation of acceleration a(t) has been done further up to a time $t_{e2}$. If the HIC(d) is calculated assuming the time $t_{e2}$ as the analysis end time $t_e$, the end time $t_{2h}$ of the period $t_{1h}$ to $t_{2h}$ necessary for the calculation of the HIC(d) will become smaller than the time $t_{e2}$, but the difference between the end time $t_{2h}$ of the period $t_{1h}$ to $t_{2h}$ necessary for the calculation of the HIC(d) and the analysis end time $t_e$ will be still smaller than the predetermined, fixed value $\Delta t$. Therefore, the time $t_{e2}$ cannot be the analysis end time $t_e$ and the performance value calculating section 12 further continues the calculation of acceleration a(t).

Figure 3C:
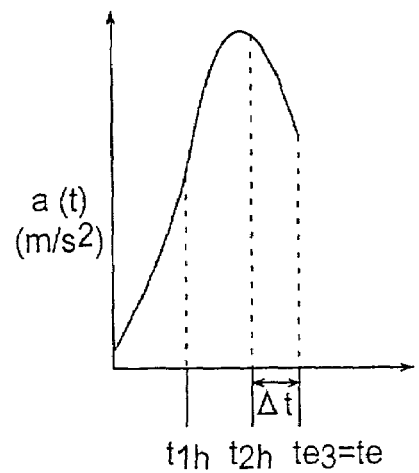

Then, as shown in FIG. 3C, there is illustrated the case where the calculation of acceleration a(t) has been conducted further up to a time $t_{e3}$. If the HIC(d) is calculated assuming the time $t_{e3}$ as the analysis end time $t_e$, the end time $t_{2h}$ of the period $t_{1h}$ to $t_{2h}$ necessary for the calculation of the HIC(d) will be smaller by $\Delta t$ than the above time $t_{e3}$, and the difference between the end time $t_{2h}$ of the period $t_{1h}$ to $t_{2h}$ necessary for the calculation of the HIC(d) and the analysis end time $t_e$ will become equal to the predetermined, fixed value $\Delta t$. Accordingly, the analysis end time determining section 16 determines the time $t_{e3}$ as the analysis end time $t_e$ and the performance value calculating section 12 ends the calculation of acceleration a(t) at the point of the time $t_{e3}$.

Figure 4:
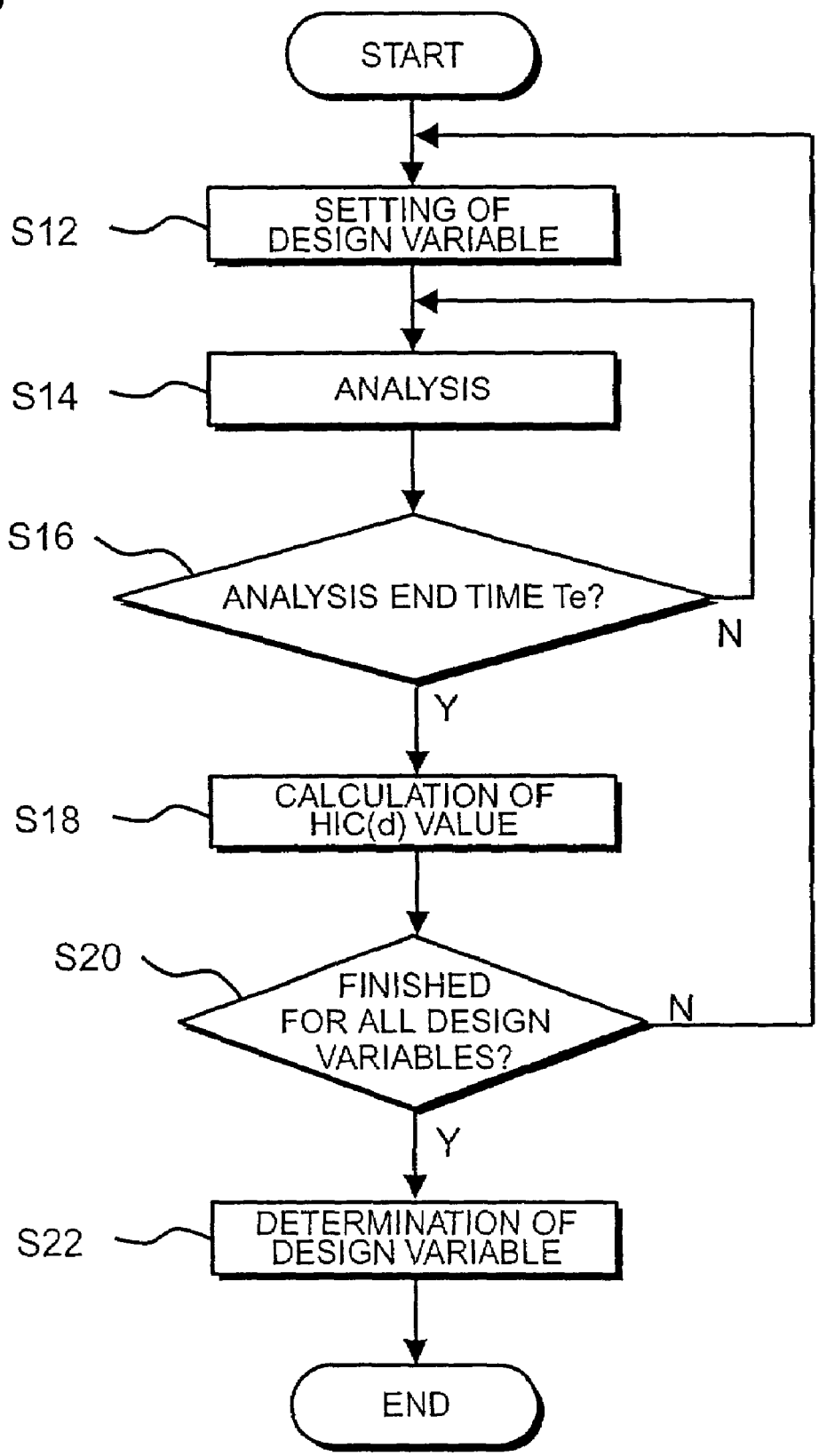
FIG. 4 is a flowchart showing the operation of the design variable optimization system.

The operation of the design variable optimization system according to the present embodiment will be described below and a design variable optimization method according to an embodiment of the present invention will also be described in connection therewith. FIG. 4 is a flowchart showing the operation of the design variable optimization system 10 according to the present embodiment. In the design variable optimization system 10 of the present embodiment, first, the design variable determining section 14 sets a design variable for the calculation of the acceleration a(t) and HIC(d) in the performance value calculating section 12 (S12). More specifically, the design variable determining section 14 sets a combination of a rib thickness of the pillar, an outer wall thickness of the pillar, and a rib interval of the pillar for the calculation of the acceleration a(t) and HIC(d) in the performance value calculating section 12.

Then the performance value calculating section 12 performs the analysis on the design article in use of the design variable thus set (S14). Here the analysis on the design article is a simulation concerning the dynamic behavior of the design article. More specifically, the acceleration a(t) of Free Motion Headform at the time t is calculated in the situation where Free Motion Headform collides with the pillar of a car having the combination of the rib thickness of the pillar, outer wall thickness of the pillar, and rib interval of the pillar set by the design variable determining section 14. The acceleration a(t) is calculated by numerically solving a modeled collision phenomenon between the pillar of the car and Free Motion Headform by use of a differential equation (simulation).

The calculation of the acceleration a(t) by the performance value calculating section 12 is carried on up to the analysis end time $t_e$ determined by the analysis end time determining section 16 (S16). Namely, the calculation of the acceleration a(t) by the performance value calculating section 12 is continued before arrival at the analysis end time $t_e$. Upon arrival at the analysis end time $t_e$ on the other hand, the calculation of the acceleration a(t) by the performance value calculating section 12 is terminated.

The determination of the analysis end time $t_e$ by the analysis end time determining section 16 is carried out as follows. Namely, as shown in FIG. 2, the analysis end time $t_e$ is determined so that the difference between the end time $t_{2h}$ of the period $t_{1h}$ to $t_{2h}$ necessary for the calculation of the HIC(d) and the analysis end time $t_e$ (the calculation end time of the acceleration a(t)) becomes the predetermined, fixed value $\Delta t$.

Describing in more detail, the analysis end time $t_e$ is determined as follows. First, as shown in FIG. 3A, there is illustrated a situation where the calculation of the acceleration a(t) has been done up to the time $t_{e1}$. If the HIC(d) is calculated assuming the time $t_{e1}$ as the analysis end time $t_e$, the end time $t_{2h}$ of the period $t_{1h}$ to $t_{2h}$ necessary for the calculation of the HIC(d) will become equal to the time $t_{e1}$, so that the difference between the end time $t_{2h}$ of the period $t_{1h}$ to $t_{2h}$ necessary for the calculation of the HIC(d) and the analysis end time $t_e$ cannot be the predetermined, fixed value $\Delta t$. Accordingly, the time $t_{e1}$ is not regarded as the analysis end time $t_e$.

Next, as shown in FIG. 3B, there is illustrated a situation where the calculation of the acceleration a(t) has been executed further up to the time $t_{e2}$. If the HIC(d) is calculated assuming the time $t_{e2}$ as the analysis end time $t_e$, the end time $t_{2h}$ of the period $t_{1h}$ to $t_{2h}$ necessary for the calculation of the HIC(d) will become smaller than the time $t_{e2}$, but the difference between the end time $t_{2h}$ of the period $t_{1h}$ to $t_{2h}$ necessary for the calculation of the HIC(d) and the analysis end time t, will be still smaller than the predetermined, fixed value $\Delta t$. Therefore, the time $t_{e2}$ is not regarded as the analysis end time $t_{e1}$ either.

Then, as shown in FIG. 3C, there is illustrated a situation where the calculation of the acceleration a(t) has conducted further up to the time $t_{e3}$. If the HIC(d) is calculated assuming the time $t_{e3}$ as the analysis end time $t_e$, the end time $t_{2h}$ of the period $t_{1h}$ to $t_{2h}$ necessary for the calculation of the HIC(d) will be smaller by $\Delta t$ than the time $t_{e3}$, and the difference between the end time $t_{2h}$ of the period $t_{1h}$ to $t_{2h}$ necessary for the calculation of the HIC(d) and the analysis end time $t_e$ will become equal to the predetermined, fixed value $\Delta t$. Accordingly, the time $t_{e3}$ is determined as the analysis end time $t_e$.

After the analysis end time $t_e$ is determined, the performance value calculating section 12 calculates the HIC(d) for the set combination of the rib thickness of pillar, outer wall thickness of pillar, and rib interval of pillar (S18).

The steps of the setting of design variable (S12) to the calculation of HIC(d) (S18) are carried out for numerous design variables while giving various change to the design variable as the combination of rib thickness of pillar, outer wall thickness of pillar, and rib interval of pillar.

After the steps of the setting of design variable (S12) to the calculation of HIC(d) (S18) are finished for all the design variables in the range to take into account (S20), the design variable determining section 14 determines as an optimal combination of the rib thickness of the pillar, the outer wall thickness of the pillar, and the rib interval of the pillar, a combination of rib thickness of the pillar, outer wall thickness of the pillar, and rib interval of pillar presenting a minimum of the HIC(d) calculated by the performance value calculating section 12 under the set combinations of rib thickness of the pillar, outer wall thickness of the pillar, and rib interval of the pillar (S22).

Next, the action and effect of the design variable optimization system according to the present embodiment will be described. The design variable optimization system 10 of the present embodiment determines the analysis end time $t_e$ so that the prescribed relation is satisfied by the end time $t_{2h}$ of the period $t_{1h}$ to $t_{2h}$ necessary for the calculation of the HIC(d) and the analysis end time $t_e$. Therefore, long and protracted analysis (the calculation of the acceleration a(t)) is prevented from being performed for the time unnecessary for the calculation of the HIC(d), so that the analysis can be achieved with high efficiency. In consequence, the optimal design variable (the optimal combination of rib thickness of the pillar, outer wall thickness of the pillar, and rib interval of the pillar) can be determined within a short time.

The design variable optimization system 10 of the present embodiment determines the analysis end time $t_e$, particularly, so that the difference between the end time $t_{2h}$ of the period $t_{1h}$ to $t_{2h}$ necessary for the calculation of the HIC(d) and the analysis end time $t_e$ becomes the predetermined, fixed value $\Delta t$. Therefore, the analysis end time $t_e$ can be readily determined. As a result, expediency is enhanced.

When the simulation concerning the dynamic behavior of the design article is necessitated on the occasion of determination of design variable, the simulation concerning the dynamic behavior is often accompanied by calculation of numerical solutions to a differential equation and often requires a long period of time. The design variable optimization system 10 of the present embodiment can efficiently curtail the time necessary for the determination of design variable, particularly, in the case wherein the simulation concerning the dynamic behavior of the design article is necessary on the occasion of determination of design variable as described above (e.g., when the pillar of car is designed).

The design variable optimization system 10 of the above embodiment was configured to determine the analysis end time $t_e$, particularly, so that the difference between the end time $t_{2h}$ of the period $t_{1h}$ to $t_{2h}$ necessary for the calculation of the HIC(d) and the analysis end time $t_e$ became the predetermined, fixed value $\Delta t$, but the analysis end time $t_e$ may also be determined by other criteria. For example, the analysis end time $t_e$ may be determined so that a ratio ($t_{2h}/t_e$) of the end time $t_{2h}$ of the period $t_{1h}$ to $t_{2h}$ necessary for the calculation of the HIC(d) to the analysis end time $t_e$ becomes a fixed value K (K>1).

Figure 5:
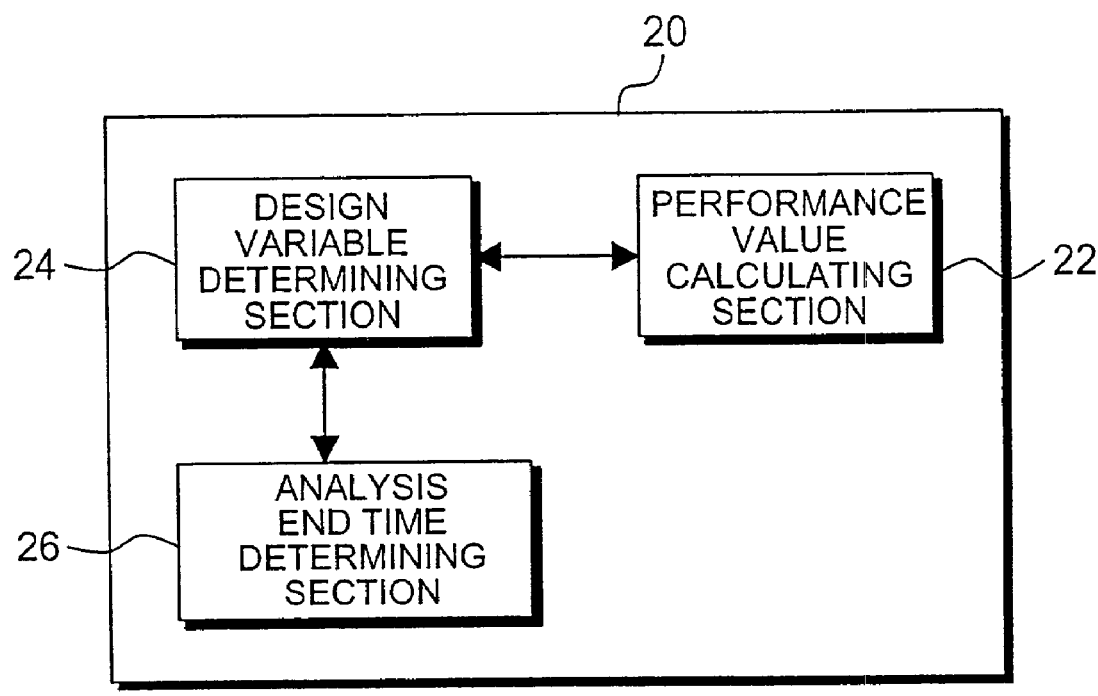
FIG. 5 is a block diagram of another design variable optimization system in accordance with the present invention.

In the design variable optimization system 10 of the above embodiment the performance value calculating section 12 was configured to receive the analysis end time $t_e$ directly from the analysis end time determining section 16 and terminate the calculation of the acceleration a(t) at the point of the analysis end time $t_e$, but the system may also be constructed like a design variable optimization system 20 as shown in FIG. 5. Namely, the design variable optimization system 20 is constructed in structure in which the design variable determining section 24 receives the analysis end time $t_e$ determined by the analysis end time determining section 26 and controls the analysis end time $t_e$ of the acceleration a(t) in the performance value calculating section 22. The design variable optimization system 20 is also able to determine the optimal design variable (the optimal combination of rib thickness of the pillar, outer wall thickness of the pillar, and rib interval of the pillar) within a short time as the aforementioned design variable optimization system 10 was.

Although the design variable optimization system 10 of the above embodiment was described as the design variable optimization system for designing the pillar of a car, it is noted that the design variable optimization systems according to the present invention can be applied to determination of a specific design variable among numerous design variables according to a certain evaluation criterion, for any design article that varies its performance with change of the design variable.

The present invention can be applied to determination of a specific design variable among numerous design variables according to a certain evaluation criterion, for any design article that varies its performance with change of design variable, e.g., for pillars of cars.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A design variable optimization system for determining a specific design variable from among a plurality of design variables according to a predetermined evaluation criterion, for a design article whose performance varies with change of each of the plurality of design variables, comprising:

performance value calculating means for performing an analysis on said design article using each of said plurality of design variables and for calculating a plurality of performance values for evaluating the performance of said design article using each of the plurality of design variables, based on the result of said analysis;

design variable determining means for determining said specific design variable from among said plurality of design variables, based on each of said plurality of performance values calculated by said performance value calculating means and using said predetermined evaluation criterion; and analysis end time determining means for determining an end time of said analysis in said performance value calculating means, wherein said analysis end time determining means determines the end time of said analysis so that a difference between the end time of the period necessary for the calculation of said performance value and the end time of said analysis becomes a predetermined, fixed value, and wherein the analysis on said design article performed by said performance value calculating means is a simulation concerning dynamic behavior of said design article.

2. The design variable optimization system according to claim 1, wherein the analysis on said design article performed by said performance value calculating means is a simulation concerning dynamic behavior of said design article.

3. The design variable optimization system according to claim 1, wherein said design article is an energy absorbing part of a car.

4. The design variable optimization system according to claim 3, wherein said energy absorbing part of a car is a pillar of a car.

5. A design variable optimization method for determining a specific design variable from among a plurality of design variables according to a predetermined evaluation criterion, for a design article whose performance varies with change of each of the plurality of design variables, comprising:

a performance value calculating step of performing an analysis on said design article using each of said plurality of design variables and for calculating a plurality of performance values for evaluating the performance of said design article using each of the plurality of design variables, based on the result of said analysis;

a design variable determining step of determining said specific design variable from among said plurality of design variables, based on each of said plurality of performance values calculated in said performance value calculating step and using said predetermined evaluation criterion; and an analysis end time determining step of determining an end time of said analysis in said performance value calculating step, wherein said analysis end time determining step comprises a step of determining the end time of said analysis so that a difference between the end time of the period necessary for the calculation of said performance value and the end time of said analysis becomes a predetermined, fixed value, and wherein the analysis on said design article performed in said performance value calculating step is a simulation concerning dynamic behavior of said design article.

6. The design variable optimization method according to claim 5, wherein the analysis on said design article performed in said performance value calculating step is a simulation concerning dynamic behavior of said design article.

7. The design variable optimization method according to claim 5, wherein said design article is an energy absorbing part of a car.

8. The design variable optimization method according to claim 7, wherein said energy absorbing part of a car is a pillar of a car.

* * * * *